(12) United States Patent
Lee et al.

(10) Patent No.: US 7,164,153 B2
(45) Date of Patent: Jan. 16, 2007

(54) THIN FILM TRANSISTOR ARRAY PANEL

(75) Inventors: Su-Gyeong Lee, Seoul (KR);
Sook-Young Kang, Seoul (KR);
Myung-Koo Kang, Seoul (KR);
Hyun-Jae Kim, Seongnam (KR);
James S. Im, New York, NY (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/521,345

(22) PCT Filed: Nov. 4, 2003

(86) PCT No.: PCT/KR03/02346

§ 371 (c)(1),
(2), (4) Date: Sep. 26, 2005

(87) PCT Pub. No.: WO2004/042781

PCT Pub. Date: May 21, 2004

(65) Prior Publication Data

US 2006/0102902 A1 May 18, 2006

(30) Foreign Application Priority Data

Nov. 5, 2002 (KR) .................... 10-2002-0068108

(51) Int. Cl.
*H01L 29/04* (2006.01)
(52) U.S. Cl. ........................... 257/72; 257/59

(58) Field of Classification Search .............. 257/59, 257/72
See application file for complete search history.

(56) References Cited

U.S. PATENT DOCUMENTS

| | | | |
|---|---|---|---|
| 5,608,251 A | 3/1997 | Konuma et al. | |
| 5,742,363 A | 4/1998 | Bae | |
| 6,356,320 B1 | 3/2002 | Seop et al. | |
| 6,445,005 B1* | 9/2002 | Yamazaki et al. | 257/72 |
| 6,737,306 B1 | 5/2004 | Yamazaki et al. | |
| 2004/0065902 A1* | 4/2004 | Yamazaki et al. | 257/200 |

FOREIGN PATENT DOCUMENTS

JP 01005029 12/2001

\* cited by examiner

*Primary Examiner*—Gene M. Munson
(74) *Attorney, Agent, or Firm*—F. Chau & Associates LLC

(57) ABSTRACT

A thin film transistor array panel is provided, which includes: a substrate including a plurality of pixel areas; a semiconductor layer formed on the substrate and including a plurality of pairs of first and second semiconductor portions in respective pixel areas; a first insulating layer formed on the semiconductor layer; a gate wire formed on the first insulating layer; a second insulating layer formed on the gate wire; a data wire formed on the second insulating layer; a third insulating layer formed on the data wire; a pixel electrode formed on the third insulating layer and connected to the data wire, wherein width and length of at least one of the first and the second semiconductor portions vary between at least two pixel areas.

6 Claims, 4 Drawing Sheets

THIN FILM TRANSISTOR ARRAY PANEL

BACKGROUND OF THE INVENTION (a) Field of the Invention

The present invention relates to a TFT array panel, and in particular, to a TFT array panel for an organic electro-luminescence display.

(b) Description of the Related Art

Generally, an organic electro-luminescence (EL) display is a self emissive display device, which displays images by exciting an emissive organic material to emit light. The EL display includes an anode (hole injection electrode), a cathode (electron injection electrode), and an organic light emission layer interposed therebetween. When charge carriers are injected into the light emission layer, the electrons and the holes are pair annihilated with emitting light. The EL display further includes an electron transport layer (ETL) and a hole transport layer (HTL) for enhancing the light emission of the light emission layer as well as an electron injecting layer (EIL) and a hole injecting layer (HIL).

A plurality of pixels of the EL display are arranged in a matrix and driven in simple matrix type or active matrix type with thin film transistors (TFTs).

The passive matrix type arranges a plurality of anode lines and a plurality of cathode line to intersect each other such that selected one of the anode lines and the one of the cathode lines form a pixel to be driven, while the active matrix type connects TFTs and a capacitor to an anode electrode of each pixel such that the capacitance of the capacitor maintains the voltage of the pixel. A current of a driving TFT for supplying currents to the pixel is controlled by a data voltage supplied through a switching transistor, and a gate and a source of the switching transistor are connected to a gate line (or a scanning line) and a data line intersecting each other. When the switching transistor is turned on by the signal from the gate line, a driving voltage from the data line is applied to the gate of the driving TFT through the switching transistor and the driving TFT supplies a current to the pixels to emit light. The pixels emit red, green and blue lights for color display.

The EL display severely requires uniformity in device characteristics of the driving TFTs. It is because the difference in the device characteristics of the driving TFTs results in different luminance for the same image data and thus it causes non-uniform luminance of a display screen.

A most widely used driving TFT for the EL display includes polysilicon channel layer called low temperature polysilicon (LTPS), which is typically formed by eximer laser annealing (ELA) for crystallizing amorphous silicon. However, the polysilicon formed by ELA may have uneven crystallization due to the deviation in ELA energy, which results in non-uniform device characteristics of the TFTs to deteriorate display characteristics of the EL display.

SUMMARY OF THE INVENTION

A motivation of the present invention is to provide a thin film transistor array panel having uniform display characteristics.

A thin film transistor array panel is provided, which includes: a substrate including a plurality of pixel areas; a semiconductor layer formed on the substrate and including a plurality of pairs of first and second semiconductor portions in respective pixel areas; a first insulating layer formed on the semiconductor layer; a gate wire formed on the first insulating layer; a second insulating layer formed on the gate wire; a data wire formed on the second insulating layer; a third insulating layer formed on the data wire; a pixel electrode formed on the third insulating layer and connected to the data wire, wherein width and length of at least one of the first and the second semiconductor portions vary between at least two pixel areas.

The thin film transistor array panel may further include: a plurality of partitions for defining the pixel areas; and a plurality of organic light emission a members formed on the pixel electrodes.

Preferably, the semiconductor layer may further include a plurality of storage electrode portions, the gate wire includes a plurality of first and second gate electrodes and storage electrodes overlapping the first and the second semiconductor portions and the storage electrode portions, respectively, each of the first and the second semiconductor portions has a channel region, a source region, and a drain region, and the data wire includes a plurality of first and, second data lines, a plurality of first source electrodes connected to the first data lines and to the source regions of the first semiconductor portions, a plurality of first drain electrodes connected to the drain regions of the first semiconductor portions and to the second gate electrodes, a plurality of second source electrodes connected to the second data lines and to the source regions of the second semiconductor portions, and a plurality of second drain electrodes connected to the drain regions of the second semiconductor portions and to the pixel electrodes.

A thin film transistor array panel is provided, which includes: a plurality of first thin film transistors; a plurality of second thin film transistors connected to the first thin film thin film transistors and including channel regions having at least two widths and lengths; and a plurality of pixel electrodes connected to the second thin film transistors.

The channel regions preferably include polysilicon.

Each of the first and the second thin film transistors may have a gate, a source, and a drain, and the gates of the second thin film transistors are connected to the drains of the first thin film transistors.

BRIEF DESCRIPTION OF THE DRAWINGS

The present invention will become more apparent by describing preferred embodiments thereof in detail with reference to the accompanying drawings in which.

DETAILED DESCRIPTION OF EMBODIMENTS

Figure 1:
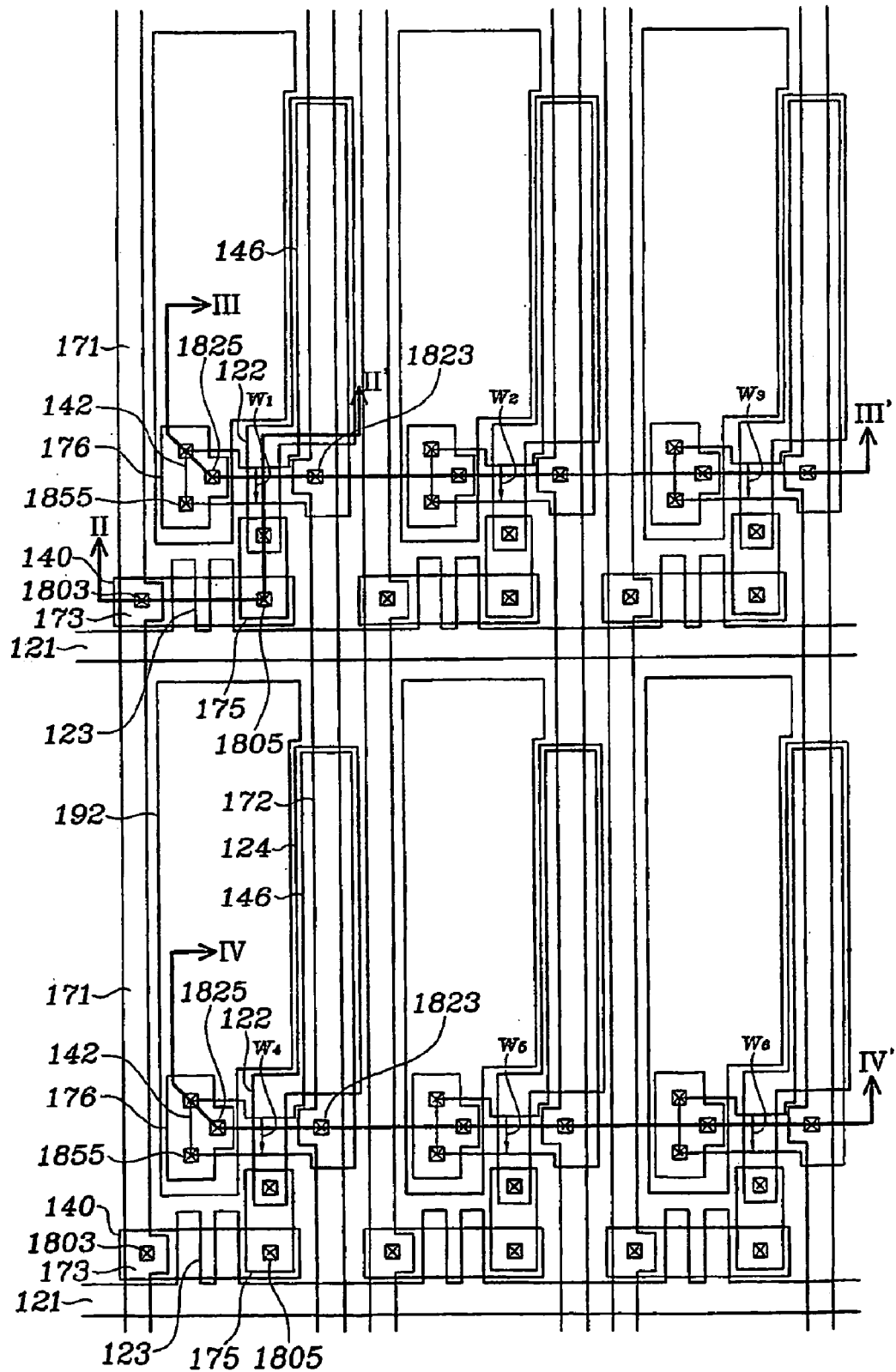
FIG. 1 is a layout view of a TFT array panel for an EL display.

The present invention now will be described more fully hereinafter with reference to the accompanying drawings, in which embodiments of the inventions are shown. The present invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Now, a TFT array panel according to embodiments of this invention will be described in detail with reference to the accompanying drawings.

Figure 2:
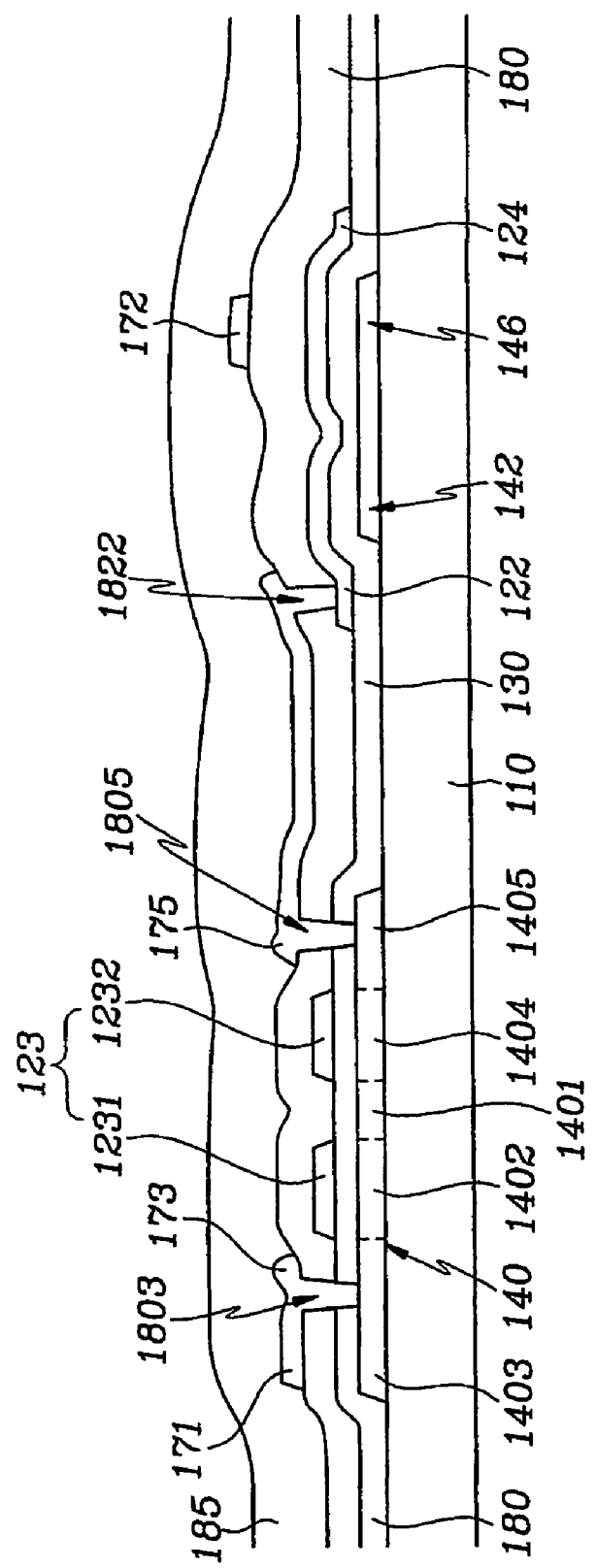
FIG. 2 is a sectional view of the TFT array panel shown in FIG. 1 taken along the line II–II'.
Figure 3:
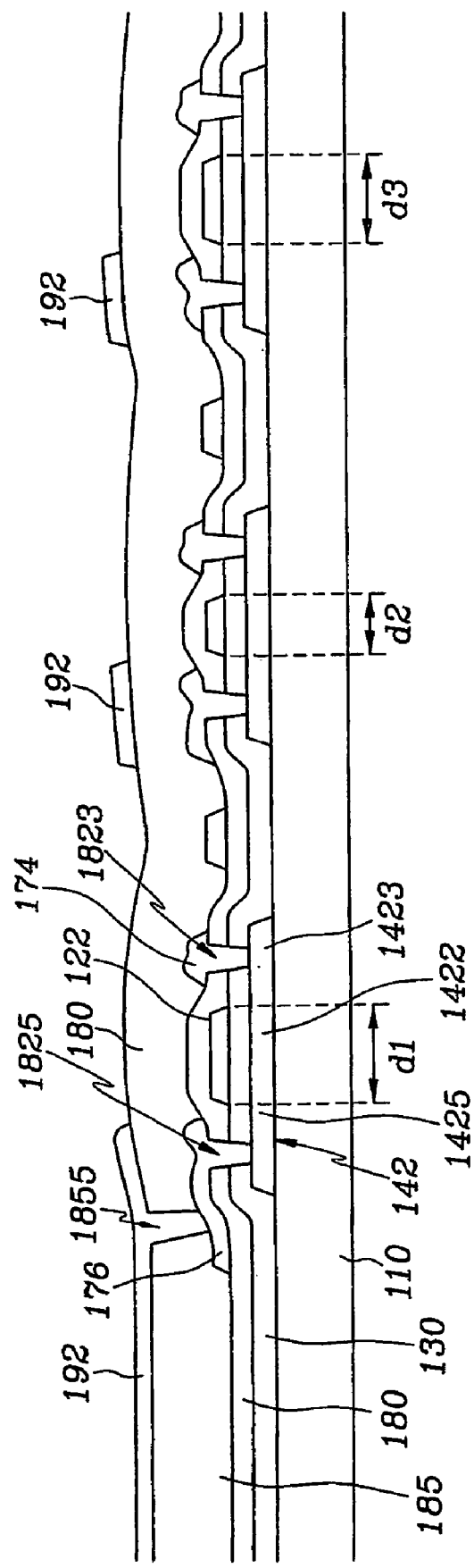
FIG. 3 is a sectional view of the TFT array panel shown in FIG. 1 taken along the line III–III'.
Figure 4:
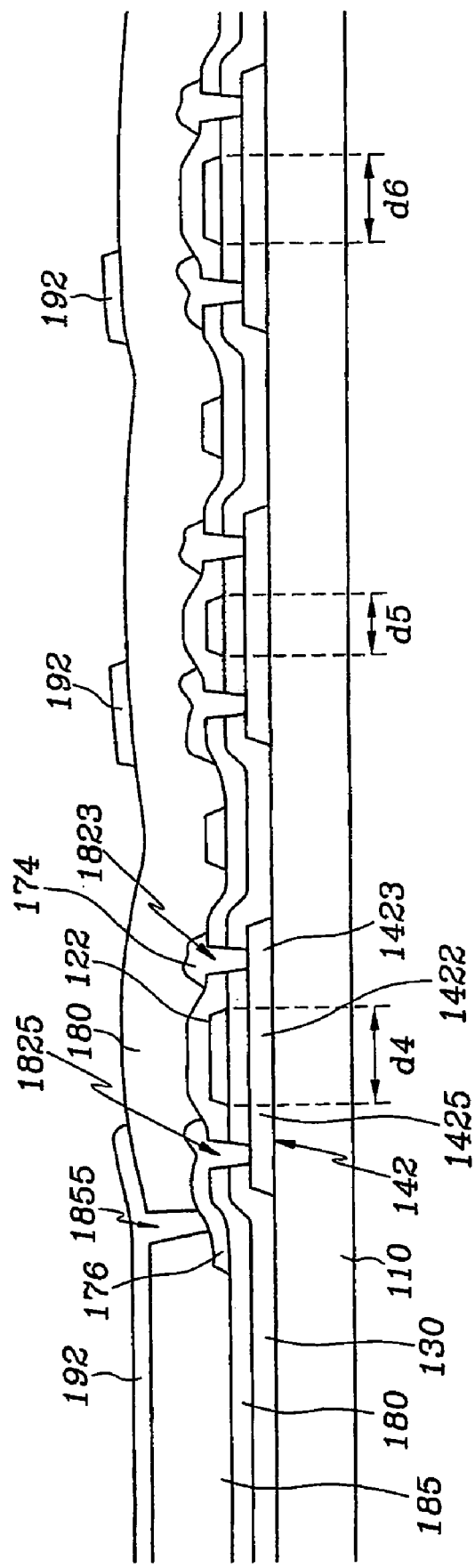
FIG. 4 is a sectional view of the TFT array panel shown in FIG. 1 taken along the line IV–IV'.

FIG. 1 is a layout view of a TFT array panel for an EL display, and FIGS. 2, 3 and 4 are sectional views of the TFT array panel shown in FIG. 1 taker along the lines II–II', III–III', and IV–IV', respectively.

A semiconductor layer preferably made of polysilicon is formed on an insulating substrate 110. The semiconductor layer includes a plurality of sets of a semiconductor portion 140 of a switching TFT, a semiconductor portion 142 of a driving TFT, and a storage capacitor portion 146. Each switching semiconductor portion 140 includes a pair of channel regions 1402 and 1404 and source and drain regions 1401, 1403 and 1405 located between and opposite side of the channel regions 1402 and 1404 and doped with n type or p type impurity, while each driving semiconductor portion 142 includes a channel region 1422 and source and drain regions 1423 and 1425 opposite each other with respect to the channel region 1422 and doped with n type or p type impurity.

According to an embodiment of the present invention, the source and drain regions 1423 and 1425 are doped with p type impurity, while the source and drain regions 1401, 1403 and 1405 of the switching TFTs are doped with n type impurity. The channel regions 1422 have different widths w1, w2, w3, w4, w5 and w6 and lengths d1, d2, d3, d4, d5 and 6d.

A blocking layer preferably made of silicon oxide or silicon nitride may be formed under the polysilicon layer 140, 142 and 146.

A gate insulating layer 130 preferably made of silicon oxide or silicon nitride is formed on the polysilicon layer 140, 142 and 146.

A gate wire is formed on the gate insulating layer 130. The gate wire includes a low resistivity conductive layer preferably made of Ag containing metal such as Ag and Ag alloy or Al containing metal such as Al and Al alloy. The gate wire may have a multilayered structure including a low resistivity conductive layer and another layer preferably made of a material having good contact characteristics with other materials.

The gate wire includes a plurality of gate lines 121 extending in a transverse direction and a plurality of first gate electrodes 123 connected to the gate lines 121 and each first gate electrode 123 includes a pair of switching electrodes 1231 and 1232 overlapping the channel regions 1402 and 1404 of the switching semiconductor portion 140, respectively. The gate wire further includes a plurality of second gate electrodes 122 separated from the gate lines 121 and overlapping the channel regions 1422 of the driving semiconductor portion 1422, and a plurality of storage electrodes 124 extending in a longitudinal direction and overlapping the storage capacitor portions 146. The gate wire-121, 122, 123 and 124 may further include a plurality of gate pads connected to ends of the gate lines 121 for transmitting gate signals from an external device to the gate lines 121. The storage electrodes 124 overlap the storage capacitor portions 146 or second data lines 172, which will be described later, to form storage capacitors.

A first interlayer insulating layer 180 preferably made of silicon nitride, silicon oxide or organic insulator is formed on the gate wire 121, 122, 123 and 124. The gate insulating layer 130 and the first interlayer insulating layer 180 have a plurality of contact holes 1803 and 1805 exposing the source and drain regions 1403 and 1405 of the switching semiconductor portions 140 and they also have a plurality of contact holes 1823 and 1825 exposing the source and drain regions 1423 and 1425 of the driving semiconductor portions 142. The gate insulating layer 130 and the first interlayer insulating layer 180 further have a plurality of contact holes 1822 exposing the second gate electrodes 122.

First and second data wires are formed on the first interlayer insulating layer 180. The first and the second data wires include a low resistivity conductive layer preferably made of Ag containing metal such as Ag and Ag alloy or Al containing metal such as Al and Al alloy. The data wires may have a multilayered structure including a low resistivity conductive layer.

The first data wire includes a plurality of first data lines 171 extending in the longitudinal direction and intersecting the gate lines 121 to define a plurality of pixel areas, a plurality of first source electrodes 173 connected to the first data lines 171 and to the source regions 1403 of the switching semiconductor portions 140 through the contact holes 1803, and a plurality of first drain electrodes 175 separated from the first source electrodes 173 and connected to the drain regions 1405 of the switching semiconductor portions 140 through the contact holes 1805 and to the source regions 1423 of the driving semiconductor portions 142.

The second data wire includes a plurality of second data lines 172 extending substantially in the longitudinal direction and overlapping the storage electrodes 124, a plurality of second source electrodes 174 corrected to the second data lines 172 and to the source regions 1423 of the driving semiconductor portions 149 through the contact holes 1823, and a plurality of second drain electrodes 176 separated from the second source electrodes 174 and connected to the drain regions 1425 of the driving semiconductor portions 142 through the contact holes 1825.

Although it is not shown in the figures, the first and the second data wires may include a plurality of data pads connected to the first and the second data lines 171 and 172 for transmitting electrical signals from an external source to the first and the second data lines 171 and 172.

A second interlayer insulating layer 185 having a plurality of contact holes 1855 exposing the second drain electrodes 176 is formed on the data wire 171, 172, 173, 174, 175 and 176, and a plurality of pixel electrodes 192 preferably made of transparent material such as indium tin oxide (ITO) and indium zinc oxide (IZO) are formed on the second interlayer insulating layer 185. The pixel electrodes 192 are connected to the second drain electrodes 176 through the contact holes 1855 of the second interlayer insulating layer 185.

Although it is not shown in the figures, the TFT array panel for an EL display according to the embodiment of the present invention further includes a plurality of red, green and blue organic light emission members formed on the pixel electrodes 192 and a plurality of pixel partitions preferably made of organic material for partitioning the light emission members.

As described above, the TFT array panel according to the embodiment of the present invention includes the plurality of channel regions 1422 of the driving TFTs provided in the respective pixel areas having different widths w1, w2, w3, w4, w5 and w6 and different lengths d1, d2, d3, d4, d5 and 6d. The various widths and lengths of the channel regions of the driving TFTs diversify the driving capacity of the TFTs, and local or global distribution of the driving TFTs with different driving capacities prevents image deterioration of on-screen stripes due to energy deviation of laser beam used for eximer laser annealing (ELA) or sequential lateral solidification for converting amorphous silicon into polysilicon. In particular, the difference in size between grains due to the laser energy difference between shots can be covered by the diversity of the driving capacity of the driving TFTs, thereby keeping uniform image quality.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor array panel comprising:
   a substrate including a plurality of pixel areas;
   a semiconductor layer formed on the substrate and including a plurality of pairs of first and second semiconductor portions in respective pixel areas;
   a first insulating layer formed on the semiconductor layer;
   a gate wire formed on the first insulating layer;
   a second insulating layer formed on the gate wire;
   a data wire formed on the second insulating layer;
   a third insulating layer formed on the data wire;
   a pixel electrode formed on the third insulating layer and connected to the data wire,
   wherein width and length of at least one of the first and the second semiconductor portions vary between at least two pixel areas.

2. The thin film transistor array panel of claim 1, further comprising:
   a plurality of partitions for defining the pixel areas; and
   a plurality of organic light emission members formed on the pixel electrodes.

3. The thin film transistor array panel of claim 1, wherein the semiconductor layer further includes a plurality of storage electrode portions,
   the gate wire includes a plurality of first and second gate electrodes and storage electrodes overlapping the first and the second semiconductor portions and the storage electrode portions, respectively,
   each of the first and the second semiconductor portions has a channel region, a source region, and a drain region, and
   the data wire includes a plurality of first and second data lines, a plurality of first source electrodes connected to the first data lines and to the source regions of the first semiconductor portions, a plurality of first drain electrodes connected to the drain regions of the first semiconductor portions and to the second gate electrodes, a plurality of second source electrodes connected to the second data lines and to the source regions of the second semiconductor portions, and a plurality of second drain electrodes connected to the drain regions of the second semiconductor portions and to the pixel electrodes.

4. A thin film transistor array panel comprising:
   a plurality of first thin film transistors;
   a plurality of second thin film transistors connected to the first thin film thin film transistors and including channel regions having at least two widths and lengths; and
   a plurality of pixel electrodes connected to the second thin film transistors.

5. The thin film transistor array panel of claim 4, wherein the channel regions comprise polysilicon.

6. The thin film transistor array panel of claim 4, wherein each of the first and the second thin film transistors has a gate, a source, and a drain; and the gates of the second thin film transistors are connected to the drains of the first thin film transistors.

* * * * *